(12) United States Patent
Kawasaki

(10) Patent No.: US 7,595,531 B2
(45) Date of Patent: Sep. 29, 2009

(54) SEMICONDUCTOR DEVICE

(75) Inventor: Hisao Kawasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 11/843,332

(22) Filed: Aug. 22, 2007

(65) Prior Publication Data
US 2008/0067558 A1 Mar. 20, 2008

(30) Foreign Application Priority Data
Sep. 15, 2006 (JP) .............................. 2006-250516

(51) Int. Cl.
H01L 29/49 (2006.01)
H01L 29/78 (2006.01)
(52) U.S. Cl. ................ 257/343; 257/141; 257/E29.152
(58) Field of Classification Search ................. 257/341, 257/343, 339
See application file for complete search history.

(56) References Cited

U.S. PATENT DOCUMENTS 6,798,020 B2 * 9/2004 Disney et al. ............... 257/342

2005/0242370 A1 * 11/2005 Weber et al. ................. 257/135

FOREIGN PATENT DOCUMENTS

| DE | 103 13 712 A1 | 10/2004 |
| JP | 2000-3919 | 1/2000 |
| JP | 2000-315804 A | 11/2000 |
| JP | 2000315804 A * | 11/2000 |
| JP | 2001-144106 | 5/2001 |
| JP | 2003-218130 | 7/2003 |
| JP | 2005-191022 | 7/2005 |
| WO | WO 2006/025971 A1 | 3/2006 |

* cited by examiner

Primary Examiner—Jerome Jackson, Jr.
Assistant Examiner—Dale Page
(74) Attorney, Agent, or Firm—Oblon, Spivak, McClelland, Maier & Neustadt, L.L.P.

(57) ABSTRACT

A semiconductor device according to one embodiment of the present invention includes: a semiconductor substrate having an operation layer on the top surface thereof; a source electrode and a drain electrode disposed on the operation layer; a gate electrode disposed between the source electrode and the drain electrode; and a field plate electrode disposed on an insulating film deposited between the gate electrode and the drain electrode. At least a part of the gate electrode is disposed in a gate recess formed in the operation layer, the field plate electrode is apart from the gate electrode by a predetermined distance, and at least a part of the field plate electrode is disposed in a field plate recess formed in the operation layer.

7 Claims, 3 Drawing Sheets

SEMICONDUCTOR DEVICE

CROSS-REFERENCE TO RELATED APPLICATION

This application claims priority based on Japanese Patent Application No. 2006-250516 filed Sep. 15, 2006, the contents of which are hereby incorporated by reference in their entirety.

BACKGROUND OF THE INVENTION (1) Field of the Invention

The present invention relates to a semiconductor device, and more particularly to improvement of a semiconductor device having a field plate electrode.

(2) Description of the Related Art

Semiconductor devices that use a field plate electrode to relax electric field concentration on a gate electrode have recently been applied to practical use (see, for example, Japanese Patent Application Laid-Open No. 2000-315804).

The structure of an example of such conventional semiconductor devices is shown in FIG. 1. In the figure, formed on a semiconductor substrate 1 is an operation layer 2, on which a source electrode 3 and a drain electrode 4 in ohmic contact therewith are disposed. A recess 5 is formed in the semiconductor layer between the source electrode 3 and the drain electrode 4. Formed in the recess 5 is a gate electrode 6 with a Schottky junction, and formed on a surface protection film 7 made of an insulating material is a field plate electrode 8.

Forming the gate electrode 6 in the recess 5 is for the purpose of keeping the Schottky interface of the gate electrode 6 away from the surface of the operation layer 2 to avoid the effect of the surface level so that the semiconductor device operates stably. The field plate electrode 8 is provided for relaxing electric field concentration on the gate electrode 6, and plays an important role in increasing the output of the semiconductor device.

To increase the effect of relaxing the electric field concentration, it is desirable that the field plate electrode 8 be disposed near the Schottky interface between the gate electrode 6 and the operation layer 2, and be lengthened in the channel direction.

However, in a conventional semiconductor device as shown in FIG. 1, the gate electrode 6 is formed in the recess 5 and the field plate electrode 8 is formed on the surface of the operation layer 2. As a result, the field plate electrode 8 is spatially far away from the gate electrode 6. The electric field concentration on the gate electrode 6 is therefore not sufficiently relaxed. Further, lengthening the field plate electrode 8 in the channel direction (C direction) increases the feedback capacitance between the gate and the drain. This makes it difficult to achieve stable operation of a semiconductor device, which may lead to causing oscillation.

As described above, a semiconductor device having a conventional field plate electrode as shown in FIG. 1 has a problem that a sufficient effect on relaxing the electric field concentration on the gate electrode cannot be achieved since the field plate electrode is spatially far away from the gate electrode. This causes damage to the stable operations of the semiconductor device.

A semiconductor device having a field plate electrode that is integrated with a gate electrode and projects toward a drain electrode by a predetermined distance on a surface protection film is known (see Japanese Patent Application Laid-Open No. 2001-144106). Such a semiconductor device, however, has a problem that a projecting portion needs to be lengthened and thinned in order to increase the effect of relaxing the electric field concentration.

BRIEF SUMMARY OF THE INVENTION

In view of the conventional problems as described above, the present invention provides a semiconductor device having a field plate electrode that allows electric field concentration on the gate electrode to be sufficiently relaxed so that the semiconductor device operates stably.

According to an aspect of the invention, there is provided a semiconductor device including: a semiconductor substrate having an operation layer on the top surface thereof; a source electrode and a drain electrode disposed on the operation layer; a gate electrode disposed between the source electrode and the drain electrode; and a field plate electrode disposed on an insulating film deposited between the gate electrode and the drain electrode, wherein at least a part of the gate electrode is disposed in a gate recess formed in the operation layer, the field plate electrode is apart from the gate electrode by a predetermined distance, and at least a part of the field plate electrode is disposed in a field plate recess formed in the operation layer.

According to an aspect of the invention, there can be achieved a semiconductor device having a field plate electrode that allows electric field concentration on the gate electrode to be sufficiently relaxed so that the semiconductor device operates stably without causing oscillation.

DETAILED DESCRIPTION OF THE INVENTION

Embodiments of the present invention will be described below with reference to the accompanying drawings.

First Embodiment

Figure 1:
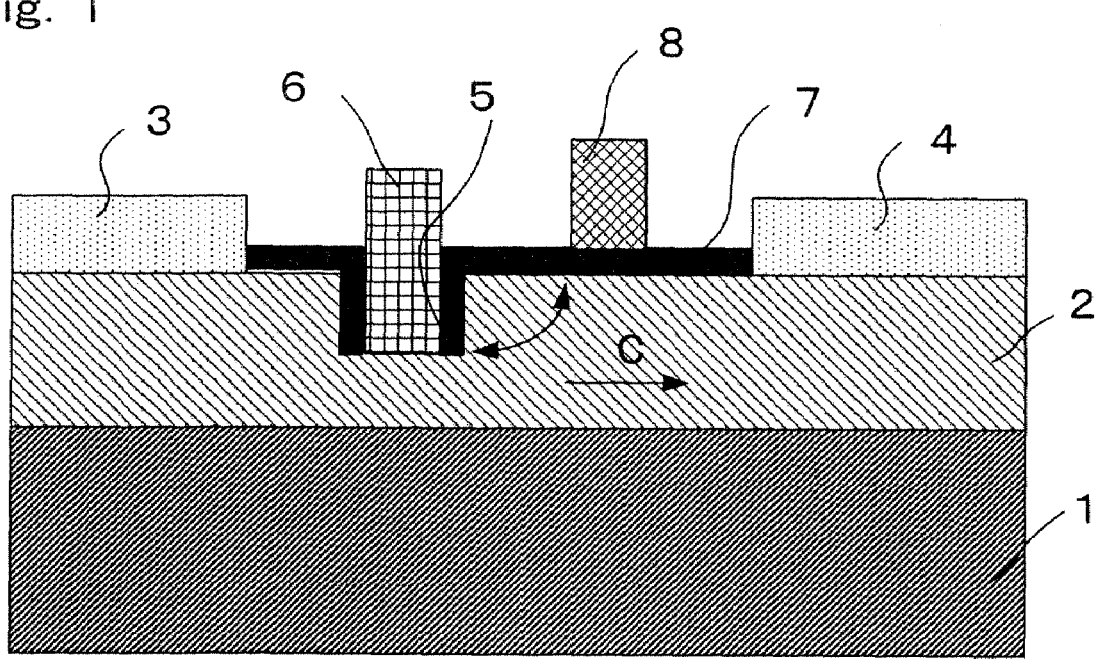
FIG. 1 is a cross-sectional view showing the structure of a conventional semiconductor device having a field plate electrode.
Figure 2:
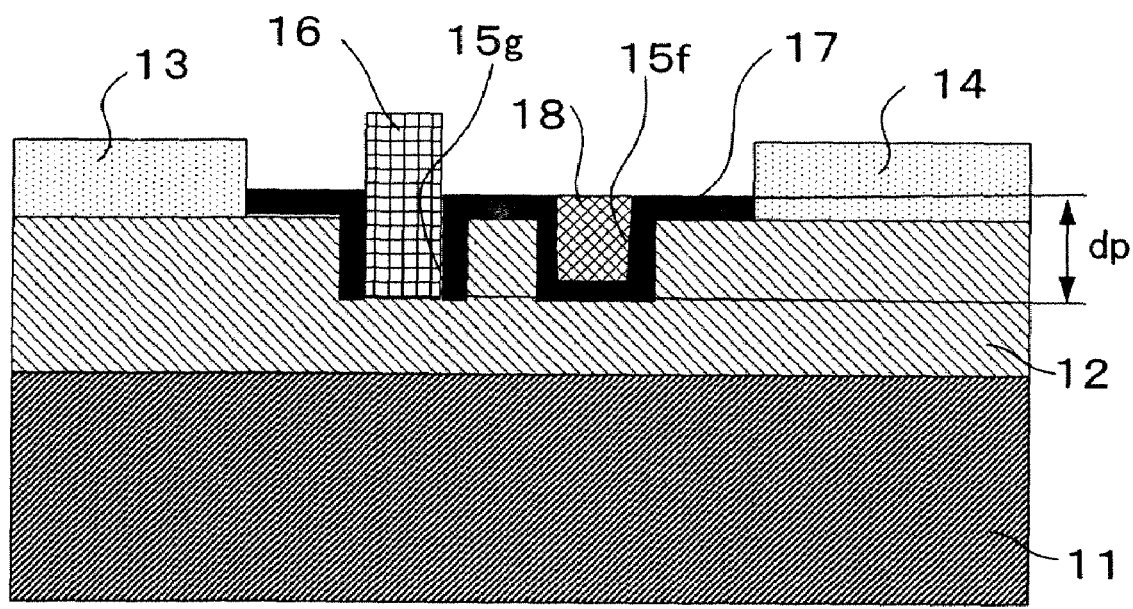
FIG. 2 is a cross-sectional view showing the structure of a semiconductor device according to a first embodiment of the present invention.
Figure 3:
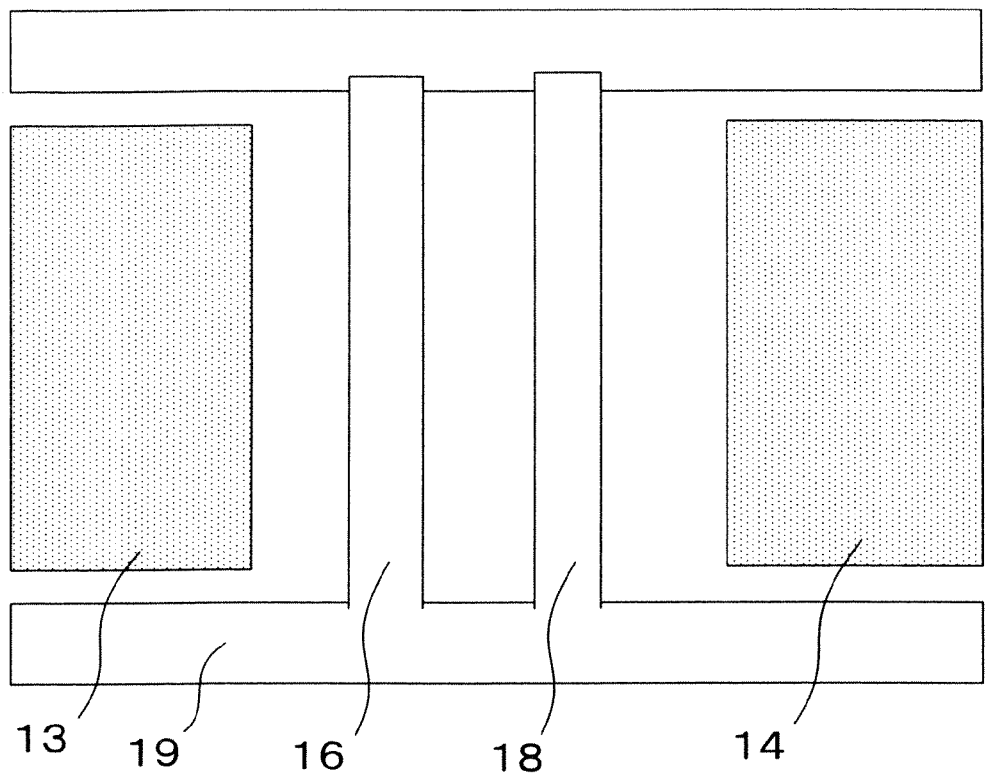
FIG. 3 is a plan view of the semiconductor device.

FIG. 2 is a cross-sectional view and FIG. 3 is a plan view of a semiconductor device according to an embodiment of the invention.

In this semiconductor device, an operation layer 12 is formed on a semiconductor substrate 11 as shown in FIG. 2. A source electrode 13 and a drain electrode 14, which are in ohmic contact with the operation layer 12, are disposed apart from each other by a predetermined distance on the operation layer 12. A gate recess 15g and a field plate recess 15f are formed between both electrodes. At least part of the gate recess 15g is formed in the operation layer 12, and at least part of the field plate recess 15f is formed in the operation layer 12. The field plate recess 15f is formed on an insulating film, e.g. a surface protection film 17, that is formed by depositing an insulation material in the operation layer 12.

A gate electrode 16 with a Schottky junction is formed in the gate recess 15g. The surface protection film 17 is placed on the side surface of the gate recess 15g, while no surface protection film is placed on the bottom of the gate recess 15g.

A field plate electrode 18 is formed on the surface protection film 17, which is made of an insulating material, on the field plate recess 15f. As shown in FIG. 3, the field plate electrode 18 is coupled to the gate electrode 16 by a gate bus bar 19, and both electrodes have the same electric potential.

As the surface protection film 17, $SiO_2$ having a film thickness of, for example, 100 nm is used. As the gate electrode 16, for example, WSi/Au is used, and as the field plate electrode 18, for example, Ti/Au is used.

If the gate recess 15g and the field plate recess 15f are formed such that the depth of the gate recess 15g (level of the bottom of the gate recess 15g) and that of the field plate recess 15f (level of the bottom surface of the surface protection film 17) are the same (level dp), the distance between the bottom edge of the gate electrode 16 and that of the field plate electrode is minimum. The minimum distance makes a field plate electrode most effective in relaxing the electric field concentration on the gate electrode. Further, it is the easiest to manufacture such a semiconductor device that includes the gate recess 15g and the field plate recess 15f having the same depth as mentioned above.

Second Embodiment

In a semiconductor device according to the first embodiment of the invention, the depth of the gate recess 15g and that of the field plate recess 15f are the same. If the depth of the field plate recess 15f is greater than that of the gate recess 15g, the parasitic resistance in a channel CH may increase. It is therefore desirable that the depth of the field plate recess 15f be substantially equal to or less than that of the gate recess 15g.

Figure 4:
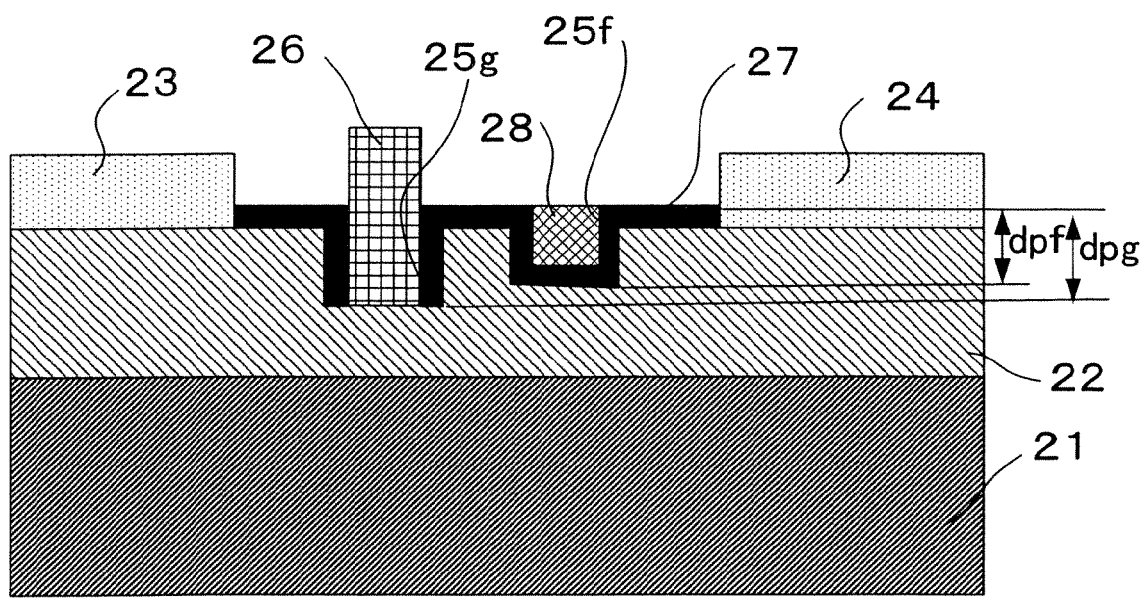
FIG. 4 is a cross-sectional view showing the structure of a semiconductor device according to a second embodiment.

FIG. 4 is a cross-sectional view of a semiconductor device according to a second embodiment of the invention, in which the depth of a field plate recess is less than that of a gate recess. In the semiconductor device shown in FIG. 4, an operation layer 22 is formed on a semiconductor substrate 21. A source electrode 23 and a drain electrode 24, which are in ohmic contact with the operation layer 22, are disposed apart from each other by a predetermined distance on the operation layer 22. A gate recess 25g having a depth of dpg and a field plate recess 25f having a depth of dpf are formed between the source electrode 23 and the drain electrode 24. The depth dpg of the gate recess 25g and the depth dpf of the field plate recess 25f have a relationship of dpg>dpf.

A gate electrode 26 with a Schottky junction is formed in the gate recess 25g. A surface protection film 27 is provided on the side surface of the gate recess 25g, while no surface protection film is placed on the bottom of the gate recess 25g.

A field plate electrode 28 is formed on the surface protection film 27 made of an insulating material on the field plate recess 25f.

As compared to the semiconductor device in the first embodiment, a semiconductor device in the second embodiment has such a structure that the depth dpf of the field plate recess 15f is less than the depth dpg of the gate recess 15g. According to this structure, the effect of reducing the resistance of the drain electrode 24 can be obtained, although the effect of relaxing the electric field concentration on the gate electrode 26 slightly decreases.

Note that it is desirable that the depth dpf of the field plate recess 15f be equal to or greater than half of the depth dpg of the gate recess 15g.

Figure 5:
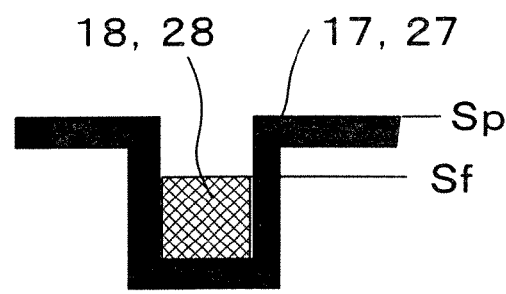
FIG. 5 is a cross-sectional view showing the structure of a modification of a field plate electrode in the embodiment.

Regarding the field plate electrodes 18 and 28 of the semiconductor devices shown in the first embodiment and the second embodiment, the top surfaces of the field plate electrodes 18 and 28 are coplanar with the top surfaces of the surface protection films 17 and 27, respectively. However, as shown in FIG. 5, such a structure that the top surface Sf of the field plate electrode 18 or 28 is lower than the top surface Sp of the surface protection film 17 or 27 may be made.

Regarding the gate electrodes 16 and 26 of the semiconductor devices shown in the first embodiment and the second embodiment, the diameters of the gate electrodes are equal to the inner diameters of the gate recesses with the surface protection films formed. However, the diameters of the gate electrodes may be smaller than the inner diameters of the recesses with the surface protection films formed.

Figure 6:
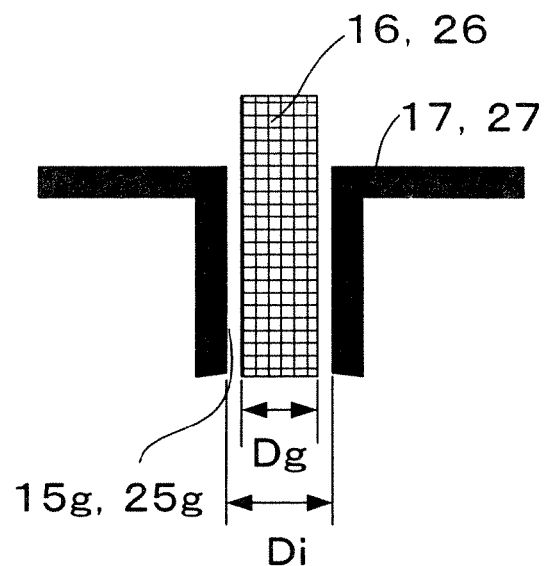
FIG. 6 is a cross-sectional view showing the structure of a modification of a gate electrode in the embodiment.

In other words, as shown in FIG. 6, a diameter Dg of the gate electrode 16 or 26 may be smaller than an inner diameter Di of the gate recess 15g or 25g with the surface protection film formed.

Likewise, regarding the field plate electrodes 18 and 28, the diameters of the electrodes may be smaller than the inner diameters of the field plate recesses with the surface protection films formed.

Third Embodiment

In this third embodiment of the invention, a semiconductor device has such a structure that exposed upper parts of the gate electrode and the field plate electrode are made large so as to cover their respective recesses.

Figure 7:
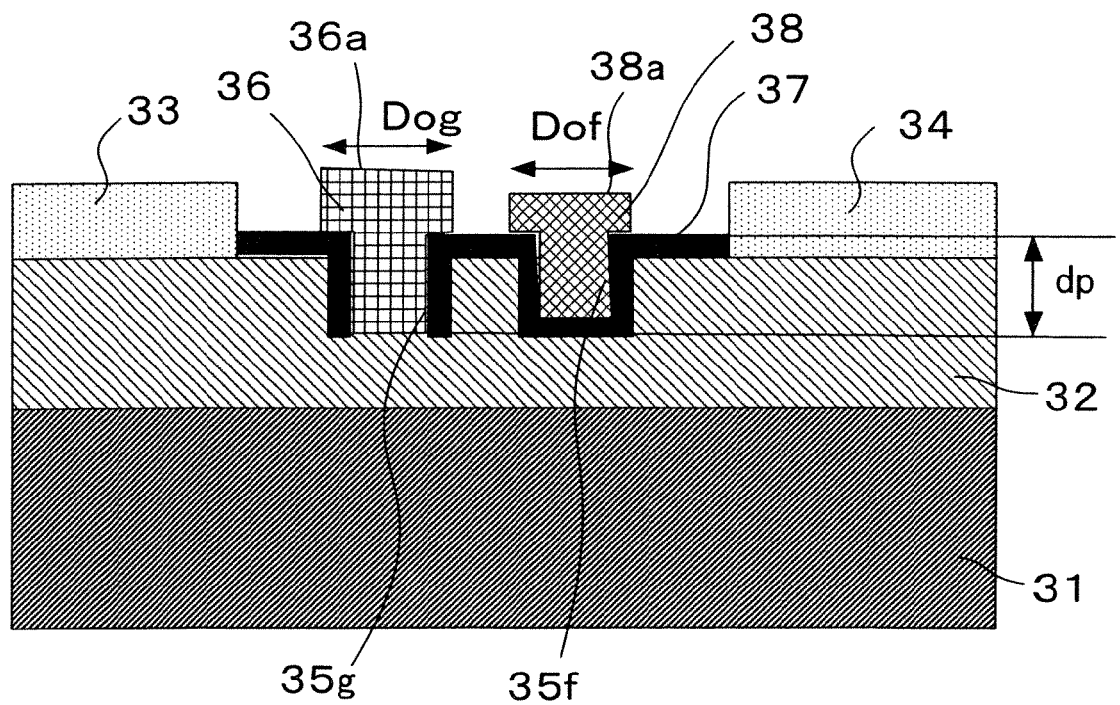
FIG. 7 is a cross-sectional view showing the structure of a semiconductor device according to a third embodiment of the invention.

In other words, in a semiconductor device shown in FIG. 7, an operation layer 32 is formed on a semiconductor substrate 31. A source electrode 33 and a drain electrode 34, which are in ohmic contact with the operation layer 32, are disposed apart from each other by a predetermined distance on the operation layer 32. A gate recess 35g and a field plate recess 35f are formed between both electrodes.

A gate electrode 36 with a Schottky junction is formed in the gate recess 35g. A surface protection film 37 is provided on the side surface of the gate recess 35g, while no surface protection film is placed on the bottom of the gate recess 35g.

A field plate electrode 38 is formed on the surface protection film 37 made of an insulating material on the field plate recess 35f. An upper portion 36a of the gate electrode 36 is made larger than a lower portion of the gate electrode 36 so as to cover the gate recess 35g. An upper portion 38a of the field plate electrode 38 is also made larger than a lower portion of the field plate electrode 38 so as to cover the field plate recess 35f.

The phrase "cover the recess" as used herein means, in the case of the gate recess, making the diameter Dog of a portion protruding above the recess of the gate electrode 36 larger than the inner diameter Di, shown in FIG. 6, of the gate recess with the surface protection film formed.

Likewise, this phrase means, in the case of the field plate recess, making the diameter D of of a portion protruding above the field plate recess 35f of the field plate electrode 38 larger than the inner diameter Di of the field plate recess 35f with the surface protection film formed.

The depth of the gate recess 35g is substantially equal to that of field plate recess 35f in this embodiment.

In this third embodiment, however, the depth of the field plate recess 35f may be less than that of the gate recess 35g as shown in the second embodiment (FIG. 4).

In the third embodiment, a relationship between the gate electrode and the gate recess or a relationship between the field plate electrode and the field plate recess can be in such a structure as shown in FIG. 6. That is, the diameters of the electrodes can be smaller than the inner diameters of the recesses with of the formed surface protection films.

Both upper parts of the gate electrode 36 and the field plate electrode 38 are made large so as to cover their respective recesses in the third embodiment. However, only one of the gate electrode 36 and the field plate electrode 38 may be made large so as to cover the recess.

Making the upper part of the electrode large so as to cover the recess can decrease the resistances of the gate electrode and the field plate electrode, and has an advantage of facilitating the manufacture of a semiconductor device.

The invention is not limited to the above embodiments, and may be implemented with various modifications to the embodiments within the scope of the technical idea of the invention.

What is claimed is:

1. A semiconductor device comprising:
   a semiconductor substrate having an operation layer on a top surface thereof;
   a source electrode and a drain electrode disposed on the operation layer, current flowing from the source electrode to the drain electrode through the operation layer;
   a gate electrode disposed between the source electrode and the drain electrode; and
   a field plate electrode coupled to the gate electrode and disposed on an insulating film deposited between the gate electrode and the drain electrode, wherein
   at least a part of the gate electrode is disposed in a gate recess formed in the operation layer, the field plate electrode is apart from the gate electrode by a predetermined distance, and at least a part of the field plate electrode is disposed in a field plate recess formed in the operation layer, wherein a depth of the field plate recess is substantially equal to a depth of the gate recess, the depth is a distance, from the top surface to a bottom, substantially perpendicular to the current flow.

2. The semiconductor device according to claim 1, wherein the gate electrode is formed so as to cover the gate recess.

3. The semiconductor device according to claim 1, wherein the field plate electrode is formed so as to cover the field plate recess.

4. A semiconductor device comprising:
   a source electrode disposed on an operation layer of a semiconductor substrate, the semiconductor substrate having the operation layer on a top surface thereof;
   a drain electrode disposed apart from the source electrode by a predetermined distance, current flowing from the source electrode to the drain electrode through the operation layer;
   a gate recess formed in the operation layer between the source electrode and the drain electrode;
   a gate electrode having at least a part thereof disposed in the gate recess;
   a field plate recess coupled to the gate electrode and formed in the operation layer between the gate recess and the drain electrode, apart from the gate electrode by a predetermined distance; and
   a field plate electrode having at least a part thereof disposed in the field plate recess, wherein a depth of the field plate recess is substantially equal to or less than a depth of the gate recess, the depth is a distance, from the top surface to a bottom, substantially perpendicular to the current flow.

5. The semiconductor device according to claim 4, wherein the gate electrode is disposed in a surface protection film provided in the gate recess excluding a bottom of the gate recess, and the field plate electrode is disposed in a surface protection film provided in the field plate recess.

6. The semiconductor device according to claim 5, wherein a diameter of a portion of the field plate electrode is larger than an inner diameter of the field plate recess with the surface protection film provided, the portion protruding outside the surface protection film.

7. The semiconductor device according to claim 5, wherein a diameter of a portion of the gate electrode is larger than an inner diameter of the gate recess with the surface protection film provided, the portion protruding outside the surface protection film.

* * * * *